(12) United States Patent
Kono et al.

(10) Patent No.: US 11,694,995 B2
(45) Date of Patent: Jul. 4, 2023

(54) SEMICONDUCTOR MEMORY DEVICE

(71) Applicant: Kioxia Corporation, Tokyo (JP)

(72) Inventors: Michihito Kono, Yokkaichi Mie (JP); Takashi Izumida, Kanagawa (JP); Tadayoshi Uechi, Kanagawa (JP); Takeshi Shimane, Chiba (JP)

(73) Assignee: Kioxia Corporation, Tokyo (JP)

(*) Notice: Subject to any disclaimer, the term of this patent is extended or adjusted under 35 U.S.C. 154(b) by 213 days.

(21) Appl. No.: 17/188,308

(22) Filed: Mar. 1, 2021

(65) Prior Publication Data
US 2022/0084984 A1 Mar. 17, 2022

(30) Foreign Application Priority Data

Sep. 17, 2020 (JP) .................... 2020-156055

(51) Int. Cl.
H10B 43/40 (2023.01)
H01L 25/065 (2023.01)
H01L 25/18 (2023.01)
H01L 23/00 (2006.01)
H10B 41/27 (2023.01)
H10B 41/41 (2023.01)
H10B 43/27 (2023.01)

(52) U.S. Cl.
CPC .......... H01L 25/0657 (2013.01); H01L 24/08 (2013.01); H01L 25/18 (2013.01); H10B 41/27 (2023.02); H10B 41/41 (2023.02); H10B 43/27 (2023.02); H10B 43/40 (2023.02); H01L 2224/08145 (2013.01); H01L 2225/06506 (2013.01); H01L 2225/06562 (2013.01); H01L 2225/06586 (2013.01); H01L 2924/1431 (2013.01); H01L 2924/14511 (2013.01)

(58) Field of Classification Search
None
See application file for complete search history.

(56) References Cited

U.S. PATENT DOCUMENTS

| 9,548,374 | B2 | 1/2017 | Zhang |
| 10,522,460 | B2 | 12/2019 | Ichinose |
| 2019/0081017 | A1 | 3/2019 | Nakajima |
| 2020/0091182 | A1 | 3/2020 | Shishido |

FOREIGN PATENT DOCUMENTS

JP H03-082162 A 4/1991

Primary Examiner — Sarah K Salerno
(74) Attorney, Agent, or Firm — Foley & Lardner LLP

(57) ABSTRACT

A semiconductor memory device, includes: a first region including a memory cell array; and a second region including a peripheral circuit. The second region includes a semiconductor substrate having a first surface and a second surface. The semiconductor substrate includes: a semiconductor region between the first and second surfaces; an n-type semiconductor region provided on the first surface and higher in donor concentration than the semiconductor region; a damaged region provided on the second surface; and a p-type semiconductor region provided between the damaged region and the n-type semiconductor region, closer to the second surface than the n-type semiconductor region in a direction from the first surface toward the second surfaces of the semiconductor substrate, and higher in acceptor concentration than the semiconductor region.

10 Claims, 9 Drawing Sheets

SEMICONDUCTOR MEMORY DEVICE

CROSS-REFERENCE TO RELATED APPLICATION

This application is based upon and claims the benefit of priority from Japanese Patent Application No. 2020-156055, filed on Sep. 17, 2020; the entire contents of which are incorporated herein by reference.

FIELD

Embodiments disclosed herein relate to a semiconductor memory device.

BACKGROUND

Known examples of a common semiconductor memory device have memory chips stacked on a wiring board.

DETAILED DESCRIPTION

Figure 1:
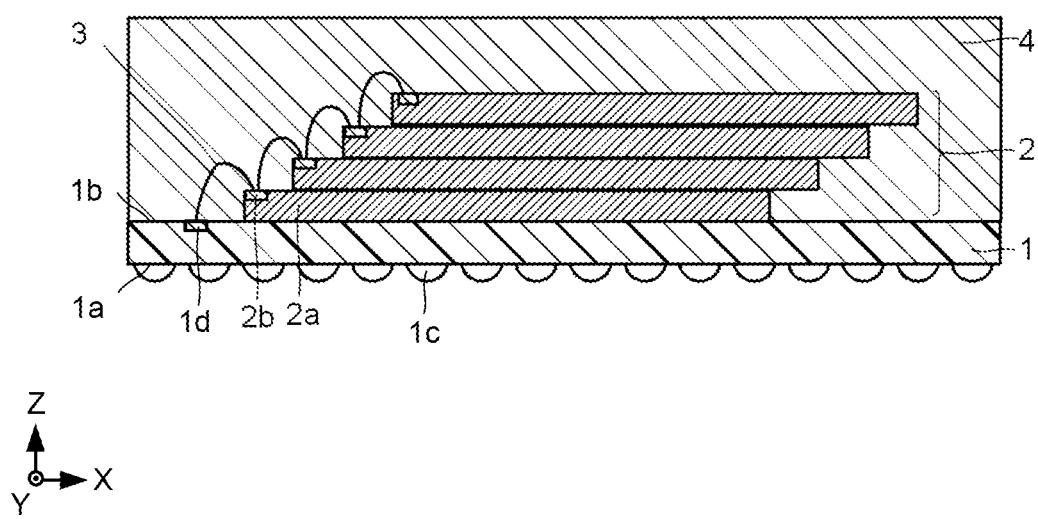
FIG. 1 is an explanatory schematic sectional view of a structure example of a semiconductor memory device.

A semiconductor memory device, includes: a first region including a memory cell array; and a second region including a peripheral circuit. The second region comprises a semiconductor substrate having a first surface and a second surface. The semiconductor substrate includes: a semiconductor region between the first and second surfaces; an n-type semiconductor region provided on the first surface and higher in donor concentration than the semiconductor region; a damaged region provided on the second surface; and a p-type semiconductor region provided between the damaged region and the n-type semiconductor region, closer to the second surface than the n-type semiconductor region in a direction from the first surface toward the second surfaces of the semiconductor substrate, and higher in acceptor concentration than the semiconductor region.

Embodiments will be hereinafter described with reference to the drawings. A relation of the thickness and planar dimension of each constituent element, thickness ratios among the constituent elements, and so on in the drawings may be different from actual ones. Further, in the embodiments, substantially the same constituent elements are denoted by the same reference signs and a description thereof may be partly omitted.

FIG. 1 is an explanatory schematic sectional view of a structure example of a semiconductor memory device and illustrates an X-axis direction along a surface of a wiring board 1, a Y-axis direction along the surface and substantially perpendicular to the X-axis, and a Z-axis direction substantially perpendicular to the surface. The semiconductor memory device includes the wiring board 1, a chip stack 2, bonding wires 3, and an insulation resin layer 4.

The wiring board 1 has a surface 1a, a surface 1b opposite the surface 1a, a plurality of external connection terminals 1c provided on the surface 1a, and a plurality of bonding pads 1d provided on the surface 1b. Examples of the wiring board 1 include a printed wiring board (PWB).

The external connection terminals 1c are formed using a material such as gold, copper, or solder. The external connection terminals 1c may be formed using lead-free solder such as tin-silver-based solder or tin-silver-copper-based solder. The external connection terminals 1c each may also be formed using a stack of a plurality of metal materials. The external connection terminals 1c are formed using conductive balls in FIG. 1, but the external connection terminals 1c may be formed using bumps.

The bonding pads 1d are connected to the external connection terminals 1c through internal wiring of the wiring board 1. The bonding pads 1d contain a metal element such as copper, silver, gold, or nickel. An example of the bonding pads 1d is made from a plating film that contains the aforesaid material and is formed by plating such as electrolytic plating or electroless plating. The bonding pads 1d may also be formed using conductive paste.

The chip stack 2 includes a plurality of memory chips 2a. The memory chips 2a are stacked in a stepped form on the surface 1b of the wiring board 1, for example. In other words, the memory chips 2a partially overlap with one another. The memory chips 2a are bonded to one another with an adhesive layer such as a die attach film therebetween. The chip stack 2 illustrated in FIG. 1 has the four memory chips 2a, but the number of the memory chips 2a is not limited to the number in FIG. 1.

The memory chips 2a each have a plurality of connection pads 2b. Through the bonding wires 3, the memory chips 2a are connected in parallel to one another and also connected in series to the bonding pads 1d.

The insulation resin layer 4 covers the chip stack 2. The insulation resin layer 4 contains an inorganic filler such as silicon oxide ($SiO_2$) and is formed by a molding method such as transfer molding, compression molding, or injection molding, using a sealing resin in which the inorganic filler is mixed with an organic resin or the like, for example.

Figure 2:
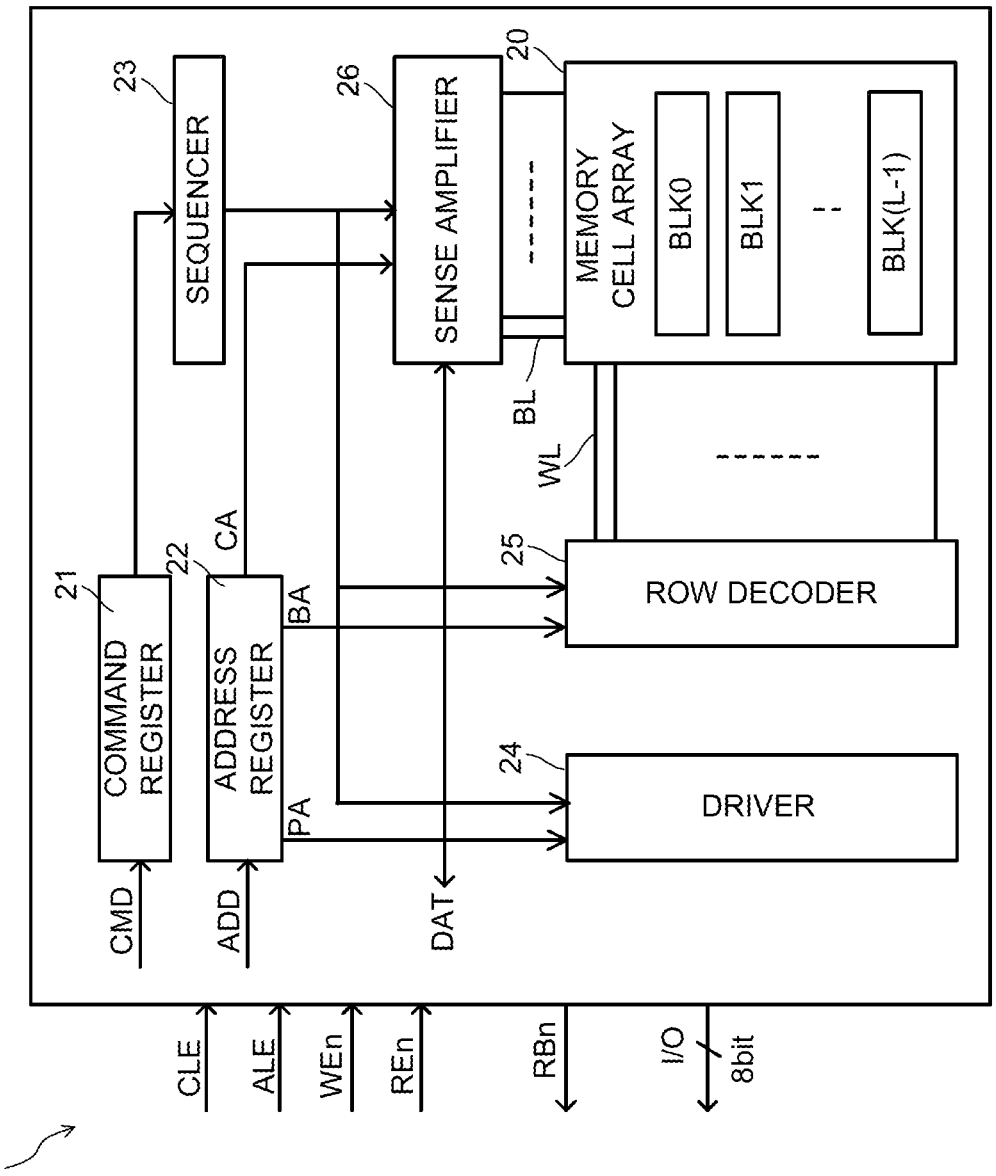
FIG. 2 is a block diagram illustrating a configuration example of a memory chip.

FIG. 2 is a block diagram illustrating a configuration example of the memory chip 2a. The memory chip 2a includes a memory cell array 20, a command register 21, an address register 22, a sequencer 23, a driver 24, a row decoder 25, and a sense amplifier 26.

The memory cell array 20 includes a plurality blocks BLK (BLK0 to BLK(L−1) (L is a natural number equal to 2 or more)). The blocks BLK are each a set of a plurality of memory transistors MT whose data storage is nonvolatile.

The memory cell array 20 is connected to a plurality of word lines WL and a plurality of bit lines BL. The memory transistors MT are each connected to one of the word lines WL and one of the bit lines BL.

The command register 21 holds a command signal CMD received from a memory controller. The command signal CMD includes, for example, command data causing the sequencer 23 to execute a read operation, a write operation, and an erase operation.

The address register 22 holds an address signal ADD received from the memory controller. The address signal ADD includes, for example, a block address BA, a page address PA, and a column address CA. For example, the block address BA, the page address PA, and the column address CA are used for selecting a block BLK, a word line WL, and a bit line BL respectively.

The sequencer 23 controls the operation of the memory chip 2a. For example, the sequencer 23 controls the driver 24, the row decoder 25, the sense amplifier 26, and so on based on the command signal CMD held in the command register 21 to execute the operation such as the read operation, the write operation, and the erase operation.

The driver 24 generates a voltage used for the read operation, the write operation, the erase operation, and so on. The driver 24 includes, for example, a DA converter. For example, the driver 24 applies the generated voltage to a signal line corresponding to the word line WL selected based on the page address PA held in the address register 22.

Based on the block address BA held in the address register 22, the row decoder 25 selects a corresponding one of the blocks BLK in the memory cell array 20. Then, for example, the row decoder 25 transfers the voltage applied to the signal line corresponding to the selected word line WL to the selected word line WL in the selected block BLK.

In the write operation, the sense amplifier 26 applies a desired voltage to each bit line BL according to write data DAT received from the memory controller. Further, in the read operation, the sense amplifier 26 determines data stored in the memory cell based on the voltage of the bit line BL and transfers the determination result as read data DAT to the memory controller.

The communication between the memory chip 2a and the memory controller supports the NAND interface protocol, for example. For example, the communication between the memory chip 2a and the memory controller uses a command latch enable signal CLE, an address latch enable signal ALE, a write enable signal WEn, a read enable signal REn, a ready/busy signal RBn, and an input/output signal I/O.

The command latch enable signal CLE indicates that an input/output signal I/O received by the memory chip 2a is a command signal CMD. The address latch enable signal ALE indicates that a received signal I/O is an address signal ADD. The write enable signal WEn is a signal that commands the memory chip 2a to receive an input/output signal I/O. The read enable signal REn is a signal that commands the memory chip 2a to output an input/output signal I/O.

The ready/busy signal RBn is a signal that notifies the memory controller whether the memory chip 2a is in a ready state in which it accepts a command from the memory controller or is in a busy state in which it does not accept a command.

The input/output signal I/O is a signal with, for example, an eight-bit width, and can include signals such as the command signal CMD, the address signal ADD, and the write data signal DAT.

A combination of the memory chip 2a and the memory controller described above may form one semiconductor memory device. Examples of such a semiconductor memory device include a memory card such as an SD card and a solid state drive (SSD).

Figure 3:
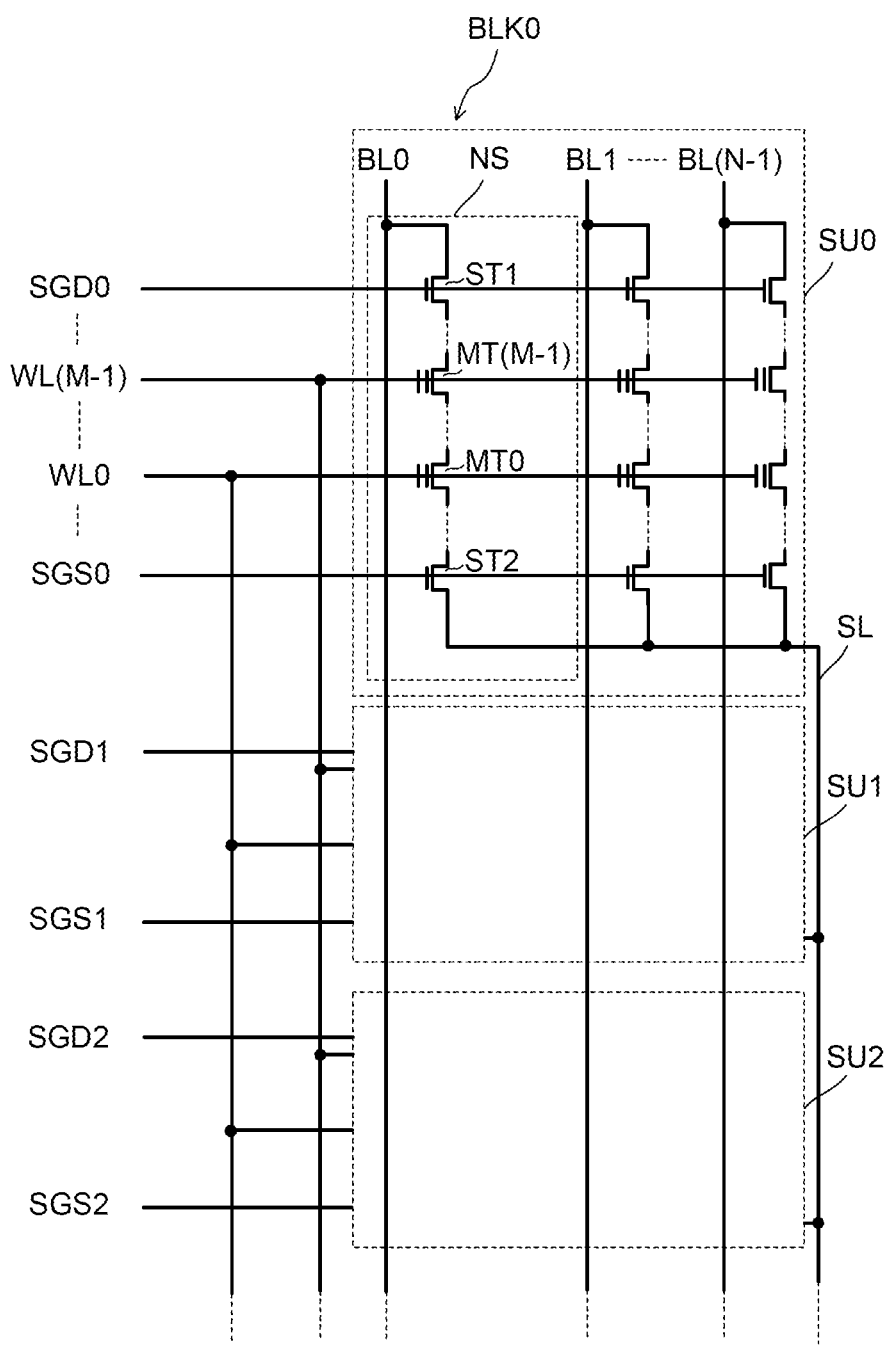
FIG. 3 is a circuit diagram illustrating the circuit configuration of a memory cell array.

Next, a circuit configuration example of the memory cell array 20 will be described. FIG. 3 is a circuit diagram illustrating the circuit configuration of the memory cell array 20. FIG. 3 illustrates the block BLK0 as an example, and the configuration of the other blocks BLK is also the same.

The block BLK includes a plurality of string units SU. The string units SU each include a plurality of NAND strings NS. FIG. 3 illustrates the three string units SU (SU0 to SU2) but the number of the string units SU is not limited.

The NAND strings NS are each connected to one of the bit lines BL (BL0 to BL(N−1) (N is a natural number equal to 2 or more)). The NAND strings NS each include the memory transistors MT, a select transistor ST1, and a select transistor ST2.

The memory transistors MT each include a control gate and a charge storage layer and hold data in a nonvolatile manner. FIG. 3 illustrates the plurality of memory transistors MT (MT0 to MT(M−1) (M is a natural number equal to or more than 2)), but the number of the memory transistors MT is not limited. The NAND strings NS have the same structure as the structure of the memory transistors MT but may include a dummy memory transistor not used for holding data.

The memory transistors MT each may be of a MONOS type whose charge storage layer is an insulation film or may be of an FG type whose charge storage layer is a conductor layer. Hereinafter, an example where it is of the MONOS type will be described in this embodiment.

The select transistor ST1 is used for selecting a string unit SU at the time of the various operations. The number of the select transistors ST1 is not limited.

The select transistor ST2 is used for selecting a string unit SU at the time of the various operations. The number of the select transistors ST2 is not limited.

In each of the NAND strings NS, a drain of the select transistor ST1 is connected to a corresponding one of the bit lines BL. A source of the select transistor ST1 is connected to one end of the serially connected memory transistors MT. The other end of the serially connected memory transistors is connected to a drain of the select transistor ST2.

In the same block BLK, the sources of the select transistors ST2 are connected to a source line SL. Gates of the select transistors ST1 of the string units SU are connected to corresponding ones of select gate lines SGD respectively. Control gates of the memory transistors MT are connected to corresponding ones of the word lines WL respectively. Gates of the select transistors ST2 are connected to corresponding ones of select gate lines SGS respectively.

In the plurality of blocks BLK, the plurality of NAND strings NS assigned the same column address CA are connected to the same bit line BL. The source line SL is connected between the plurality of blocks BLK.

First Structure Example of Memory Chip 2a

Figure 4:
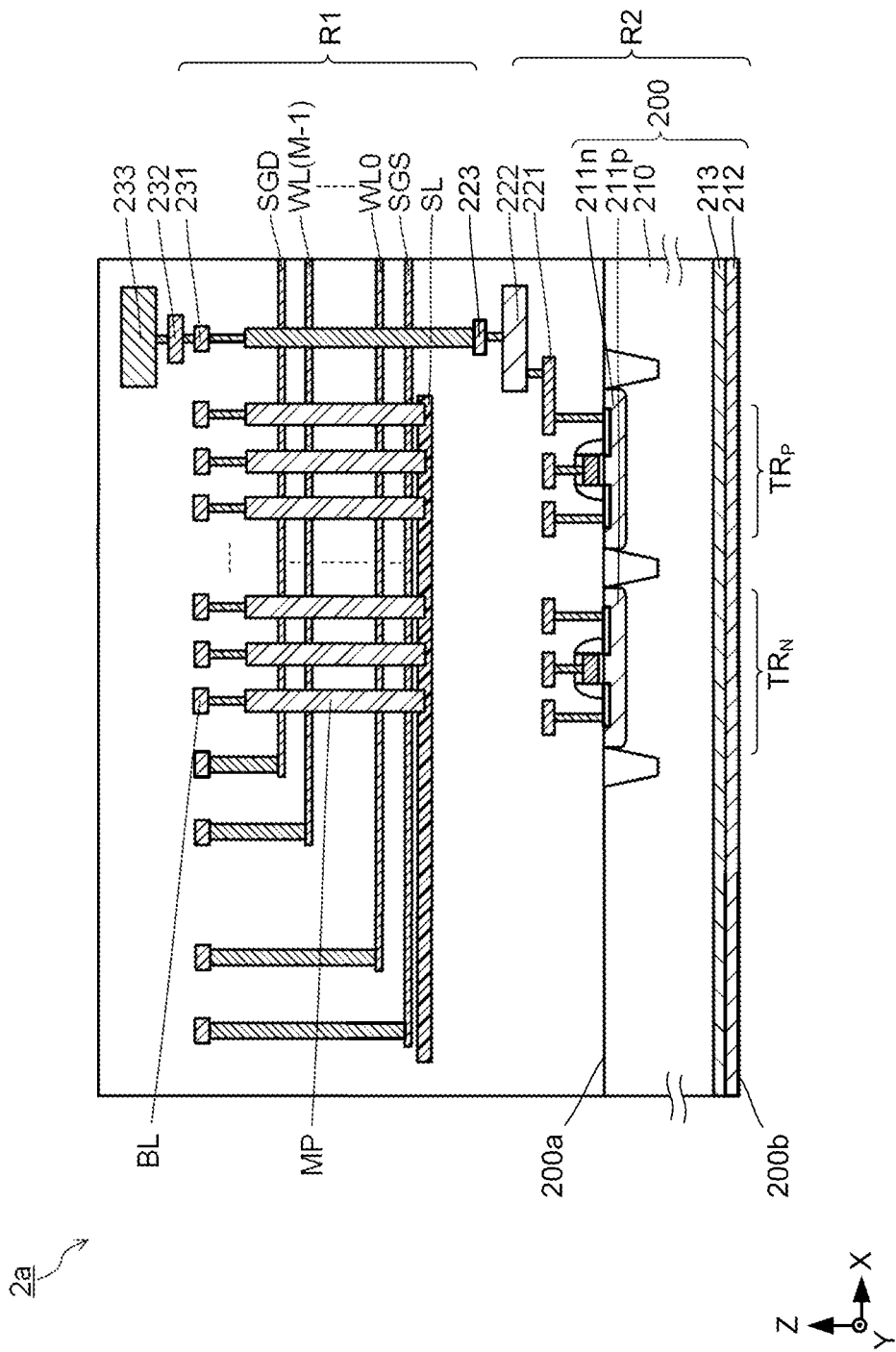
FIG. 4 is a schematic sectional view illustrating a first structure example of the memory chip.

FIG. 4 is a schematic sectional view illustrating a first structure example of the memory chip 2a and illustrates the X-axis direction along a surface of a semiconductor substrate 200, the Y-axis direction along the surface and substantially perpendicular to the X-axis, and the Z-axis direction substantially perpendicular to the surface.

The memory chip 2a illustrated in FIG. 4 includes a first region R1 including the memory cell array 20 illustrated in FIG. 2 and includes, under the memory cell array 20, a second region R2 including the peripheral circuits such as the command register 21, the address register 22, the sequencer 23, the driver 24, the row decoder 25, and the sense amplifier 26 which are illustrated in FIG. 2.

FIG. 4 illustrates a field-effect transistor (FET) $TR_N$ and a field-effect transistor $TR_P$ which are provided on the semiconductor substrate 200, conductive layers 221, a conductive layer 222, a conductive layer 223, the source line SL, memory pillars MP, the select gate line SGS, the word lines WL (the word line WL0 to the word line WL(M−1)), the select gate line SGD, the bit lines BL, a conductive layer 231, a conductive layer 232, and a conductive layer 233. An insulation layer is provided between the constituent elements as required.

The semiconductor substrate 200 includes a surface 200a, a surface 200b, a semiconductor region 210, an n-type semiconductor region (also referred to as an n-well) 211n, a p-type semiconductor region (also referred to as a p-well) 211p, a damaged region 212, and a p-type semiconductor region 213.

The semiconductor substrate 200 is thinly machined by polishing and its thickness is preferably 2 μm or more and 10 μm or less, for example. Setting it to 2 μm or more can facilitate widening the width of the n-type semiconductor region 211n. Further, setting it to 10 μm or less can reduce the occurrence of a leakage current.

The semiconductor region 210 is disposed between the surface 200a and the surface 200b, more specifically, between the n-type semiconductor region 211n and the p-type semiconductor region 213 and between the p-type semiconductor region 211p and the p-type semiconductor region 213. The semiconductor region 210 may contain acceptor impurities, for example, boron. The acceptor concentration in the semiconductor region 210 is, for example, $1\times10^{13}$ cm$^{-3}$ or more and $1\times10^{16}$ cm$^{-3}$ or less.

The n-type semiconductor region 211n is provided on the surface 200a. The n-type semiconductor region 211n forms a channel formation region of the field-effect transistor TR$_P$. The n-type semiconductor region 211n contains donor impurities, for example, phosphorus. The n-type semiconductor region 211n is higher in donor concentration than the semiconductor region 210. The donor concentration in the n-type semiconductor region 211n is preferably $1\times10^{16}$ cm$^{-3}$ or more and $1\times10^{20}$ cm$^{-3}$ or less, for example. This makes it possible to satisfy conditions of withstand voltage, leakage current, life, and so on required of the field-effect transistor TR$_P$.

The p-type semiconductor region 211p is provided on the surface 200a. The p-type semiconductor region 211p forms a channel formation region of the field-effect transistor TR$_N$. The p-type semiconductor region 211p contains acceptor impurities, for example, boron. The p-type semiconductor region 211p is higher in acceptor concentration than the semiconductor region 210. The acceptor concentration in the p-type semiconductor region 211p is preferably $1\times10^{16}$ cm$^{-3}$ or more and $1\times10^{20}$ cm$^{-3}$ or less, for example. This makes it possible to satisfy conditions of withstand voltage, leakage current, life, and so on required of the field-effect transistor TR$_N$.

The damaged region 212 is a region that is formed on a machined surface when the semiconductor substrate 200 is thinned using polishing such as gettering dry polishing and includes, for example, crystal defects, crystal distortion, and the like. The gettering dry polishing is a method to polish the semiconductor substrate 200 to form scratches that are small to a degree with which a gettering effect is exhibited while the damaged region 212 is left.

The damaged region 212 is provided on the surface 200b. The damaged region 212 is provided between the surface 200b and the p-type semiconductor region 213. The damaged region 212 is in contact with the insulation resin layer 4 illustrated in FIG. 1. The damaged region 212 extends along at least part of the surface 200b. The damaged region 212 has an irregular surface whose center average roughness is, for example, 0.8 nm or more and 0.4 μm or less and whose maximum height is 40 nm or more. The damaged region 212 makes it possible to reduce, for example, metal contamination and cleavage along a crystal plane in the semiconductor substrate 200.

The p-type semiconductor region 213 is provided between the damaged region 212 and the n-type semiconductor region 211n. The p-type semiconductor region 213 extends, for example, along the surface 200b in the entire second region R2. This is not restrictive, and the p-type semiconductor region 213 may extend along only part of the surface 200b to overlap with the plurality of n-type semiconductor regions 211n.

The p-type semiconductor region 213 contains acceptor impurities such as boron. The p-type semiconductor region 213 is higher in acceptor concentration than the semiconductor region 210. The acceptor concentration in the p-type semiconductor regions 213 is preferably $1\times10^{14}$ cm$^{-3}$ or more and $1\times10^{17}$ cm$^{-3}$ or less, for example. Setting it to $1\times10^{17}$ cm$^{-3}$ or less makes it possible to reduce the diffusion of the acceptor impurities to the substrate surface even if the semiconductor substrate 200 is thinned. Further, setting it to $1\times10^{14}$ cm$^{-3}$ or more makes it possible to, for example, reduce the excessive spread of a depletion layer of the field-effect transistor TR$_N$.

The p-type semiconductor region 213 is closer to the surface 200b than the n-type semiconductor region 211n in the thickness direction (Z-axis direction) of the semiconductor substrate 200. The p-type semiconductor region 213 has the peak of the acceptor concentration at its position closer to the surface 200b than its middle portion in terms of the thickness direction of the semiconductor substrate 200. It is possible to form the p-type semiconductor region 213 by injecting the acceptor impurities from the surface 200b side and thereafter activating the injected impurities by heat treatment such as laser annealing, for example.

Figure 5:
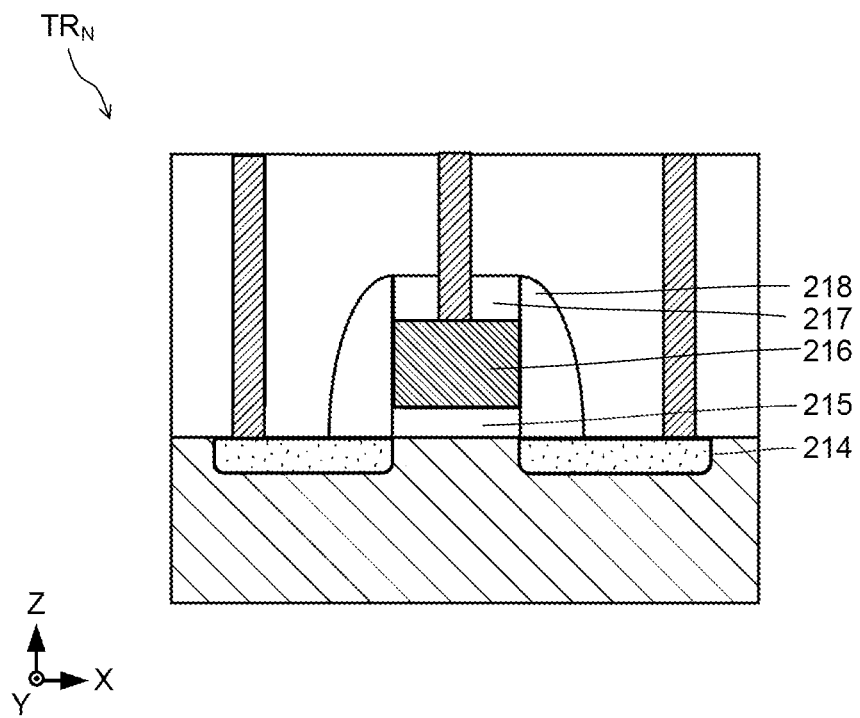
FIG. 5 is a schematic sectional view illustrating a structure example of a field-effect transistor.

Next, a structure example of the field-effect transistor such as the field-effect transistor TR$_N$ and the field-effect transistor TR$_P$ will be described. FIG. 5 is a schematic sectional view illustrating the structure example of the field-effect transistor. The field-effect transistor includes impurity regions 214, a gate insulation film 215, a gate electrode 216, an insulation film 217, and an insulation film 218. This field-effect transistor is a very low withstand voltage transistor aiming at a high-speed operation and is applicable to, for example, a peripheral circuit capable of low-voltage driving and high-speed operation. The field-effect transistor TR$_N$ and the field-effect transistor TR$_P$ each form any of the aforesaid peripheral circuits.

The impurity regions 214 each constitute a source region or a drain region of the field-effect transistor. The impurity regions 214 contain, for example, donor impurities or acceptor impurities. The pair of impurity regions 214 are each connected to one of a plurality of contact plugs.

The field-effect transistor has a channel formation region between the impurity regions 214. The field-effect transistor TR$_P$ has the channel formation region in the n-type semiconductor region 211n. The field-effect transistor TR$_N$ has the channel formation region in the p-type semiconductor region 211p.

The gate insulation film 215 is provided on the semiconductor substrate 200. The gate insulation film 215 includes, for example, a silicon oxide film.

The gate electrode 216 is provided on the gate insulation film 215. The gate electrode 216 includes a conductive layer, for example, a carbon-doped polysilicon layer, a phosphorus-doped polysilicon layer, a titanium layer, a metal nitride layer containing titanium nitride or tungsten nitride, or a tungsten layer. The gate electrode 216 may be formed of these conductive layers stacked in sequence. The gate electrode 216 is connected to one of the plurality of contact plugs.

The insulation film 217 is provided on the gate electrode 216. The insulation film 217 functions as, for example, an etching stopper when the contact plug is formed on the gate electrode 216. The insulation film 217 is, for example, a silicon nitride (SiN) film.

The insulation film 218 includes a first insulation layer and a second insulation layer provided on the first insulation layer. The first insulation layer and the second insulation layer are provided on a side surface of a stack of the gate electrode 216 and the insulation film 217 and extend along the thickness direction of the stack. The first insulation layer is, for example, a silicon dioxide ($SiO_2$) layer. The second insulation layer is, for example, a silicon nitride (SiN) layer. The insulation film 218 functions as a sidewall of the field-effect transistor such as the field-effect transistor $TR_N$ or the field-effect transistor $TR_P$.

The conductive layers 221, the conductive layer 222, and the conductive layer 223 are connected to the source or the drain of the field-effect transistor through a plurality of contact plugs.

The source line SL is provided above the field-effect transistors. The select gate line SGS is provided above the source line SL. The word lines WL are provided in sequence above the select gate line SGS. The select gate line SGD is provided above the plurality of word lines WL. The bit lines BL are provided above the select gate line SGD.

Figure 6:
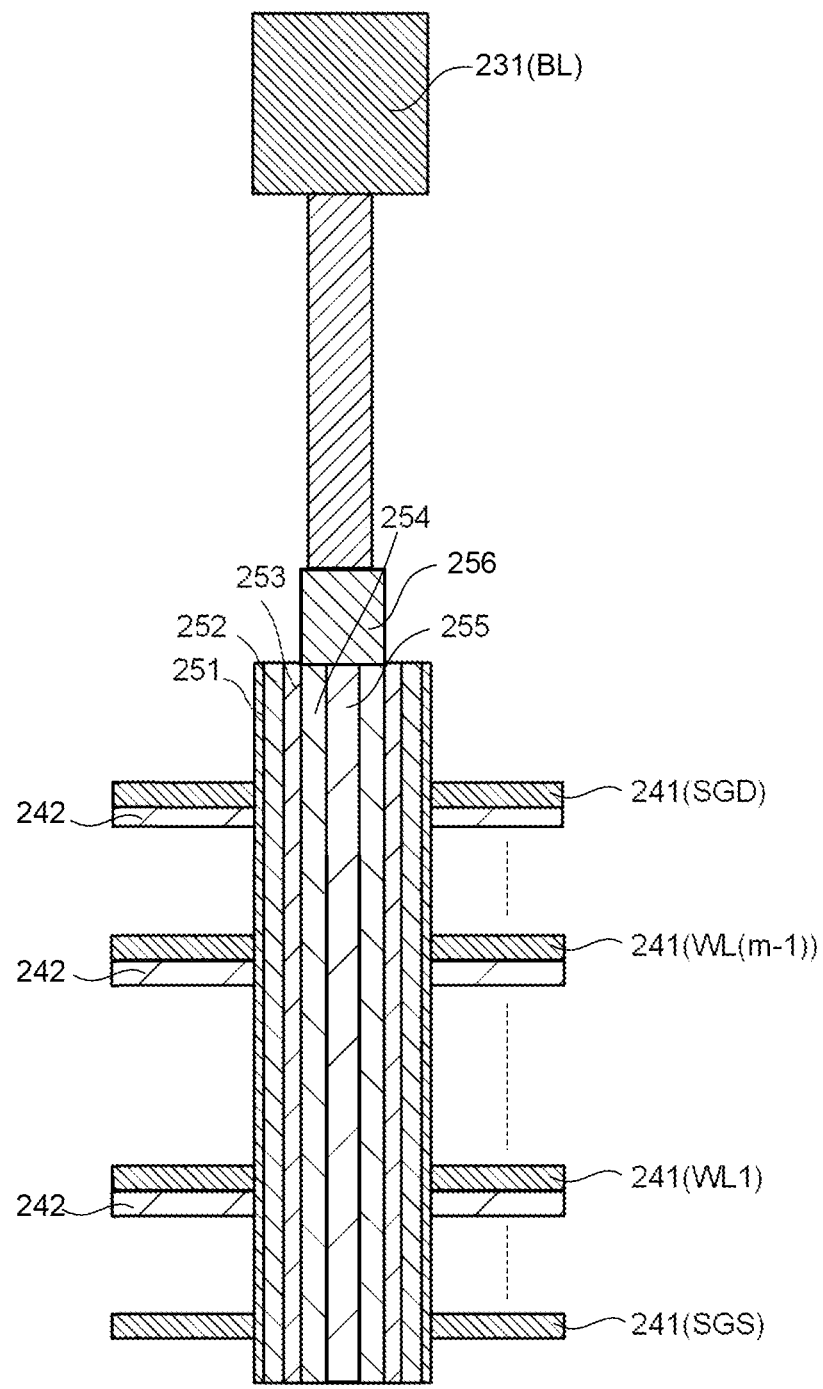
FIG. 6 is a schematic sectional view illustrating a structure example of a memory pillar.

The memory pillars MP extend through the stack including the select gate line SGS, the plurality of word lines WL, and the select gate line SGD. Here, a structure example of the memory pillar MP will be described. FIG. 6 is a schematic sectional view illustrating the structure example of the memory pillar MP. FIG. 6 illustrates conductive layers 241, insulation layers 242, a block insulation film 251, a charge storage film 252, a tunnel insulation film 253, a semiconductor layer 254, a core insulation layer 255, a cap layer 256, and the conductive layer 231.

The conductive layers 241 and the insulation layers 242 are stacked alternately to constitute stacks. The plurality of conductive layers 241 constitute the select gate line SGS, the word lines WL, and the select gate line SGD respectively. The conductive layers 241 contains a metal material. The insulation layers 242 contain, for example, silicon oxide.

The block insulation film 251, the charge storage film 252, the tunnel insulation film 253, the semiconductor layer 254, and the core insulation layer 255 constitute the memory pillar MP. The constituent elements of the memory pillar MP extend along the Z-axis direction. One memory pillar MP corresponds to one NAND string NS. Further, the block insulation film 251, the charge storage film 252, and the tunnel insulation film 253 constitute a memory layer between the stacks each composed of the conductive layer 241 and the insulation layer 242 and the semiconductor layer 254.

The block insulation film 251, the tunnel insulation film 253, and the core insulation layer 255 contain, for example, silicon oxide. The charge storage film 252 contains, for example, silicon nitride. The semiconductor layer 254 and the cap layer 256 contain, for example, polysilicon.

More specifically, a hole corresponding to the memory pillar is formed to pass through the plurality of conductive layers 241. On a side surface of the hole, the block insulation film 251, the charge storage film 252, and the tunnel insulation film 253 are stacked in sequence. Then, the semiconductor layer 254 is formed with its side surface in contact with the tunnel insulation film 253.

The semiconductor layer 254 passes through the stacks of the conductive layers 241 and the insulation layers 242 along the Z-axis direction. The semiconductor layer 254 has channel formation regions of the select transistor ST1, the select transistor ST2, and the memory transistors MT. Therefore, the semiconductor layer 254 functions as a signal line connecting current paths of the select transistor ST1, the select transistor ST2, and the memory transistors MT.

The core insulation layer 255 is provided on the inner side of the semiconductor layer 254. The core insulation layer 255 extends along the semiconductor layer 254.

The cap layer 256 is provided on the semiconductor layer 254 and the core insulation layer 255 and is in contact with the tunnel insulation film 253.

One of the conductive layers 231 is connected to the cap layer 256 through a contact plug. One of the conductive layers 231 constitutes the bit line BL. The conductive layers 231 contain a metal material.

The memory pillar MP and the conductive layer 241 constituting each of the word lines WL constitute the memory transistor MT. The memory pillar MP and the conductive layer 241 constituting the select gate line SGD constitute the select transistor ST1. The memory pillar MP and the conductive layer 241 constituting the select gate line SGS constitute the select transistor ST2.

Second Structure Example of Memory Chip 2a

Figure 7:
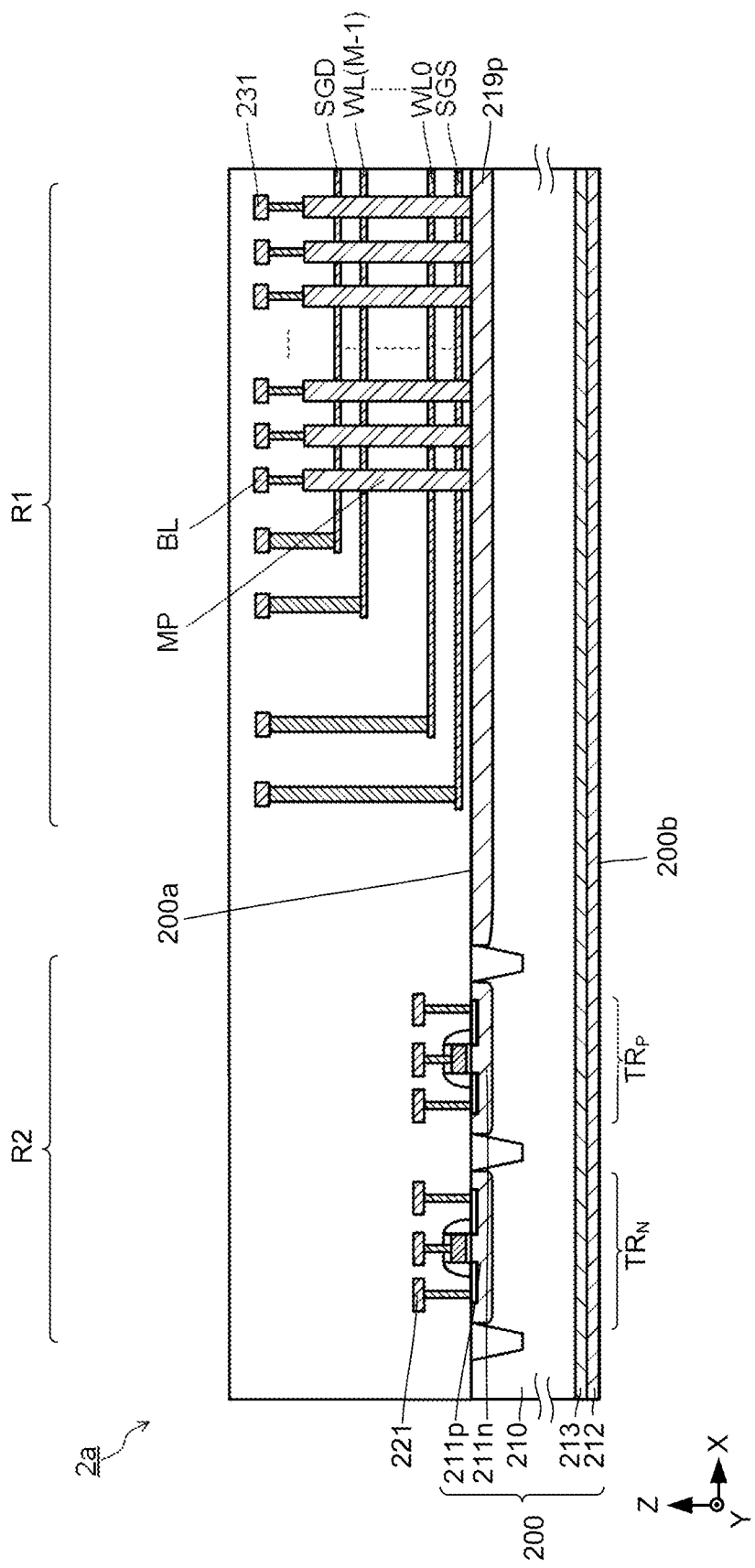
FIG. 7 is a schematic sectional view illustrating a second structure example of the memory chip.

FIG. 7 is a schematic sectional view illustrating a second structure example of the memory chip 2a and illustrates the X-axis direction along the surface of the semiconductor substrate 200, the Y-axis direction along the surface and substantially perpendicular to the X-axis, and the Z-axis direction substantially perpendicular to the surface. For the same constituent elements as those of the first structure example of the memory chip 2a, the description of the first structure example can be referred to as required.

The memory chip 2a illustrated in FIG. 7 includes the first region R1 including the memory cell array 20 illustrated in FIG. 2 and the second region R2 disposed adjacent to the memory cell array 20 side by side and including the peripheral circuits such as the command register 21, the address register 22, the sequencer 23, the driver 24, the row decoder 25, and the sense amplifier 26 which are illustrated in FIG. 2.

FIG. 7 illustrates the field-effect transistor (FET) $TR_N$ and the field-effect transistor $TR_P$ which are provided on the semiconductor substrate 200, the conductive layers 221, the memory pillars MP, the select gate line SGS, the word lines WL (the word line WL0 to the word line WL(M−1)), the select gate line SGD, the bit lines BL, and the conductive layers 231.

The semiconductor substrate 200 further includes a p-type semiconductor region 219p. The p-type semiconductor region 219p is provided under the memory cell array 20 and is provided on the surface 200a. The p-type semiconductor region 219p contains acceptor impurities, for example, boron. The p-type semiconductor region 219p is higher in acceptor concentration than the semiconductor region 210. The p-type semiconductor region 219p is connected to the not-illustrated source line SL through a contact plug.

A structure example of the field-effect transistor such as the field-effect transistor $TR_N$ and the field-effect transistor $TR_P$ is the same as the structure illustrated in FIG. 5 and therefore, a description thereof will be omitted here.

The memory pillars MP pass through the stack including the select gate line SGS, the plurality of word lines WL, and the select gate line SGD and are connected to the p-type semiconductor region 219p. A structure example of the memory pillars MP is the same as the structure illustrated in FIG. 6 and therefore, a description thereof will be omitted here.

Third Structure Example of Memory Chip 2a

Figure 8:
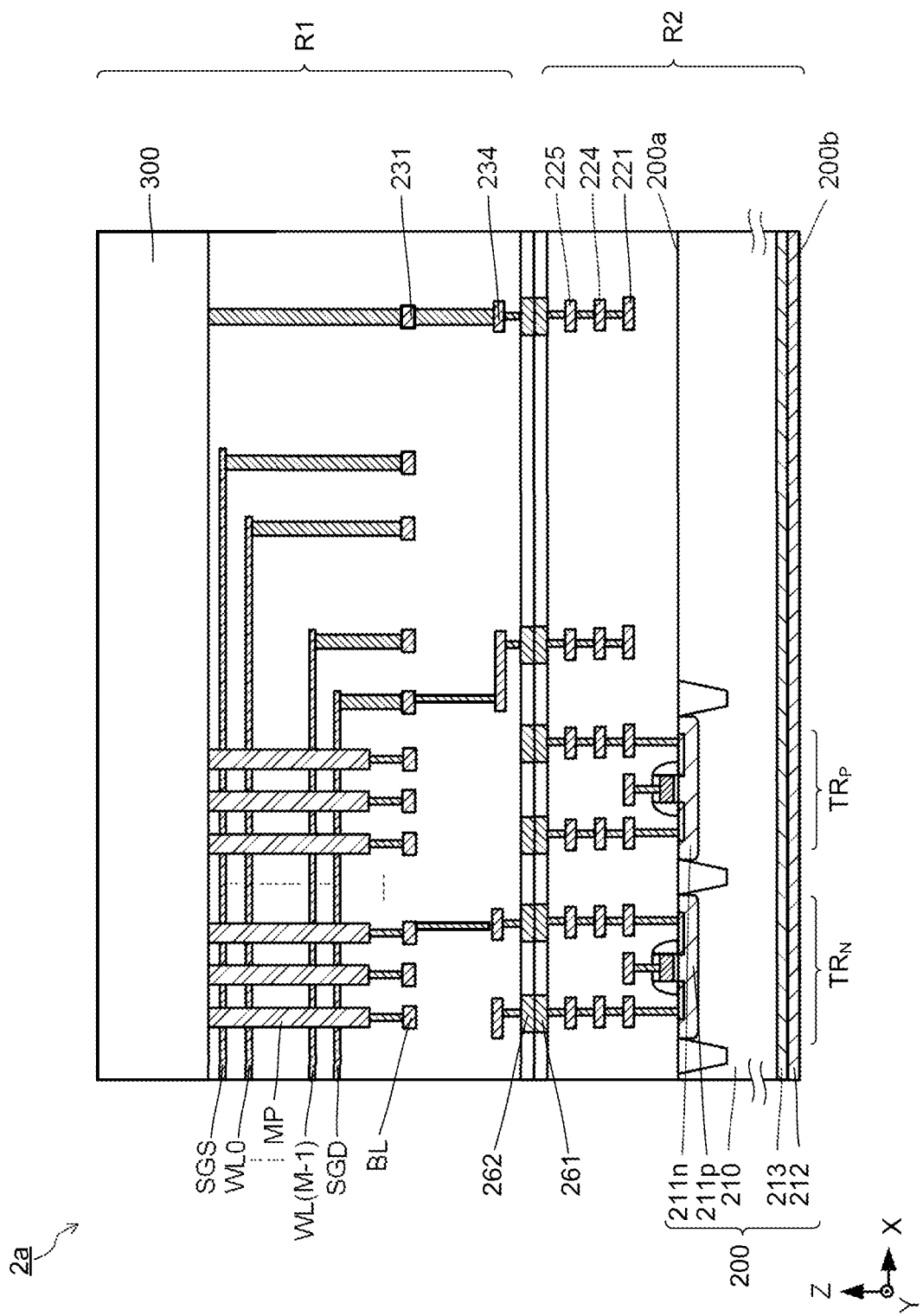
FIG. 8 is a schematic sectional view illustrating a third structure example of the memory chip.

FIG. 8 is a schematic sectional view illustrating a third structure example of the memory chip 2a and illustrates the X-axis direction along the surface of the semiconductor substrate 200, the Y-axis direction along the surface and substantially perpendicular to the X-axis, and the Z-axis direction substantially perpendicular to the surface. For the same constituent elements as those of the first structure example of the memory chip 2a, the description of the first structure example can be referred to as required.

The memory chip 2a illustrated in FIG. 8 includes the first region R1 including the memory cell array 20 and the second region R2 disposed adjacent to the memory cell array 20 and including the peripheral circuits such as the command register 21, the address register 22, the sequencer 23, the driver 24, the row decoder 25, and the sense amplifier 26. The first region R1 and the second region R2 are provided on separate substrates and are joined to each other by the substrates being pasted to each other.

FIG. 8 illustrates the field-effect transistor (FET) $TR_N$ and the field-effect transistor $TR_P$ which are provided on the semiconductor substrate 200, the conductive layers 221, the conductive layers 224, the conductive layers 225, the memory pillars MP provided on a substrate 300, the select gate line SGS, the word lines WL (the word line WL0 to the word line WL(M−1)), the select gate line SGD, the bit lines BL, the conductive layers 231, conductive layers 234, connection pads 261, and connection pads 262.

The structure of the semiconductor substrate 200 is the same as the structure illustrated in FIG. 4 and therefore a description thereof will be omitted here.

A structure example of the field-effect transistor such as the field-effect transistor $TR_N$ and the field-effect transistor $TR_P$ is the same as the structure illustrated in FIG. 5, and therefore a description thereof will be omitted here.

The memory pillars MP pass through the stack including the select gate line SGS, the plurality of word lines WL, and the select gate line SGD to be connected to the substrate 300 and are connected to the not-illustrated source line SL through the substrate 300. The other structure example of the memory pillars MP is the same as the structure illustrated in FIG. 6, and therefore a description thereof will be omitted here.

One of the conductive layers 225 is connected to the source or the drain of the field-effect transistor such as the field-effect transistor $TR_N$ and the field-effect transistor $TR_P$ through a contact plug, the conductive layer 221, and the conductive layer 224.

One of the conductive layers 234 is connected to the substrate 300 through a contact plug and the conductive layer 231. Another one of the conductive layers 234 is connected to the bit line BL through a contact plug. Still another one of the conductive layers 234 is connected to the select gate line SGS and the plurality of word lines WL or to the select gate line SGD, through a contact plug and the conductive layer 231.

The connection pads 261 are connection pads on the semiconductor substrate 200 side. The connection pads 261 are connected to the conductive layers 225 through contact plugs. The connection pads 261 contain a metal material, for example, copper or a copper alloy.

The connection pads 262 are connection pads on the substrate 300 side. The connection pads 262 are connected to the conductive layers 234 through contact plugs. The connection pads 262 contain a metal material, for example, copper or a copper alloy.

The connection pads 261 and the connection pads 262 are directly joined by, for example, element diffusion between the metals, Van der Waals force, or recrystallization due to volume expansion or melting. Further, by directly joining these by element diffusion between insulators, Van der Waals force, or chemical reaction such as dehydration condensation or polymerization, it is possible to paste the first region R1 and the second region R2 provided on the separate substrates to each other.

Examples of the substrate 300 are not limited and include a wiring board. The substrate 300 has a plurality of electrode pads on its surface, for example. The electrode pads are connected to the memory pillars MP and contact plugs.

In the semiconductor memory device described in the first to third structure examples, at the time of the erase operation, the driver 24 generates a erase voltage (VERA) to supply it to the memory cell array 20. However, the memory chip 2a, which is thinned by polishing such as gettering dry polishing, may cause a failure that the erase voltage saturate to a value less than a predetermined value. This failure may cause an operation failure of the semiconductor memory device.

Figure 9:
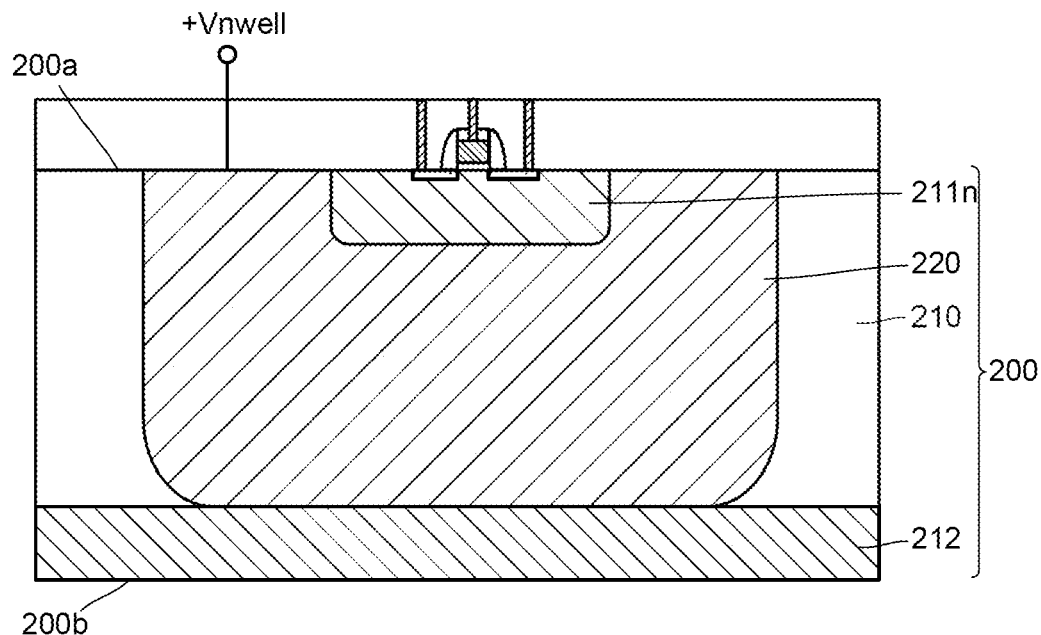
FIG. 9 is a schematic view illustrating a state of a field-effect transistor.
Figure 10:
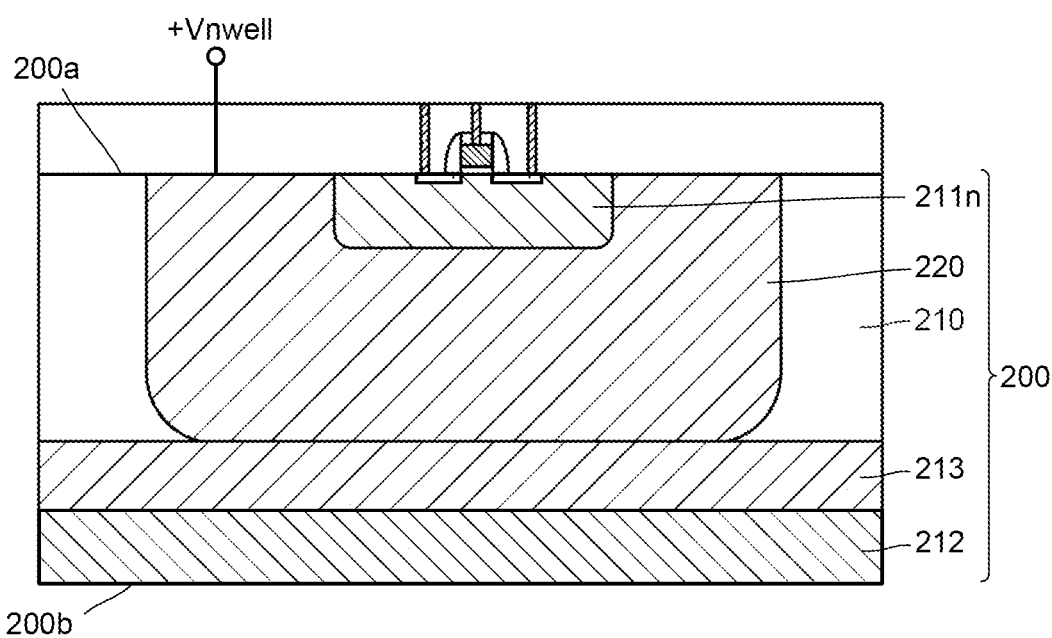
FIG. 10 is a schematic view illustrating a state of a field-effect transistor.

One possible cause of the aforesaid failure is a leakage current through the damaged region 212. FIG. 9 and FIG. 10 are schematic views illustrating states of a field-effect transistor. When a voltage $V_{nwall}$ that is a predetermined positive voltage is applied to the n-type semiconductor region 211n, a depletion layer 220 is formed in the semiconductor region 210.

If the p-type semiconductor region 213 is not formed, the depletion layer 220 comes into contact with the damaged region 212 as illustrated in FIG. 9. The contact of the depletion layer 220 with the damaged region 212 may cause, for example, a leakage current through the damaged region 212, resulting in the flow of the current to another n-type semiconductor region. Not only this but also the generation and re-bonding of carries in the damaged region 212 is considered as one cause of the aforesaid failure, for example.

On the other hand, in the semiconductor memory device of this embodiment, forming the p-type semiconductor region 213 makes it possible to prevent the spread of the depletion layer 220 up to the damaged region 212, as illustrated in FIG. 10. This can inhibit the saturation of the erase voltage. Therefore, it is possible to provide a highly reliable semiconductor memory device.

While certain embodiments of the present invention have been described above, these embodiments have been presented by way of example only, and are not intended to limit the scope of the invention. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a first region including a memory cell array; and
a second region including a peripheral circuit,
the second region comprising a semiconductor substrate having a first surface and a second surface,
the semiconductor substrate including:
- a semiconductor region between the first and second surfaces;
- an n-type semiconductor region provided on the first surface and higher in donor concentration than the semiconductor region;
- a damaged region provided on the second surface; and
- a p-type semiconductor region provided between the damaged region and the n-type semiconductor region, closer to the second surface than the n-type semiconductor region in a direction from the first surface toward the second surface of the semiconductor substrate, and higher in acceptor concentration than the semiconductor region.

2. The device according to claim 1, wherein the semiconductor substrate has a thickness of 2 µm or more and 10 µm or less.

3. The device according to claim 1, wherein the donor concentration in the n-type semiconductor region is $1\times10^{16}$ cm$^{-3}$ or more and $1\times10^{20}$ cm$^{-3}$ or less.

4. The device according to claim 1, wherein the acceptor concentration in the p-type semiconductor region is $1\times10^{16}$ cm$^{-3}$ or more and $1\times10^{20}$ cm$^{-3}$ or less.

5. The device according to claim 1, wherein the p-type semiconductor region extends along the second surface in the entire second region.

6. A semiconductor memory device comprising:
a wiring board;
a chip stack including a plurality of memory chips, the plurality of memory chips being stacked above the wiring board; and
an insulation resin layer covering the chip stack,
at least one chip selected from the group consisting of the plurality of memory chips comprising a first region including a memory cell array and a second region including a peripheral circuit,
the second region comprising a semiconductor substrate having a first surface and a second surface, and
the semiconductor substrate including:
- a semiconductor region between the first and second surfaces;
- an n-type semiconductor region provided on the first surface and higher in donor concentration than the semiconductor region;
- a damaged region provided on the second surface and being in contact with the insulation resin layer; and
- a p-type semiconductor region provided between the damaged region and the n-type semiconductor region, closer to the second surface than the n-type semiconductor region in a direction from the first surface toward the second surface of the semiconductor substrate, and higher in acceptor concentration than the semiconductor region.

7. The device according to claim 6, wherein the semiconductor substrate has a thickness of 2 µm or more and 10 µm or less.

8. The device according to claim 6, wherein the donor concentration in the n-type semiconductor region is $1\times10^{16}$ cm$^{-3}$ or more and $1\times10^{20}$ cm$^{-3}$ or less.

9. The device according to claim 6, wherein the acceptor concentration in the p-type semiconductor region is $1\times10^{16}$ cm$^{-3}$ or more and $1\times10^{20}$ cm$^{-3}$ or less.

10. The device according to claim 6, wherein the p-type semiconductor region extends along the second surface in the entire second region.

* * * * *